United States Patent
Haque

(10) Patent No.: US 7,463,514 B1
(45) Date of Patent: Dec. 9, 2008

(54) MULTI-LEVEL CELL SERIAL-PARALLEL SENSE SCHEME FOR NON-VOLATILE FLASH MEMORY

(75) Inventor: Rezaul Haque, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/766,248

(22) Filed: Jun. 21, 2007

(51) Int. Cl.
G11C 11/34 (2006.01)

(52) U.S. Cl. ............................. 365/185.03; 365/185.21; 365/185.2

(58) Field of Classification Search ............ 365/185.03, 365/185.21, 185.2
See application file for complete search history.

(56) References Cited

U.S. PATENT DOCUMENTS

| 5,539,690 | A | 7/1996 | Talreja et al. |
| 5,721,701 | A | 2/1998 | Ikebe et al. |
| 6,115,290 | A | 9/2000 | Kwong |
| 7,054,197 | B2 * | 5/2006 | Vimercati ............... 365/185.18 |
| 7,057,934 | B2 | 6/2006 | Krishnamachari et al. |
| 7,106,626 | B2 | 9/2006 | Goldman et al. |
| 7,385,843 | B2 * | 6/2008 | Guterman et al. ...... 365/185.03 |

* cited by examiner

Primary Examiner—Huan Hoang
(74) Attorney, Agent, or Firm—Cool Patent, P.C.

(57) ABSTRACT

A method of sensing data in a multi-level cell memory using two or less sense operations and adjusting column load is provided. A sensing circuit implementing a serial-parallel sense scheme is also provided. The column loads are re-configurable based on the sensing circuit and the serial-parallel sense scheme.

15 Claims, 4 Drawing Sheets

MULTI-LEVEL CELL SERIAL-PARALLEL SENSE SCHEME FOR NON-VOLATILE FLASH MEMORY

BACKGROUND

Flash memory data is stored as a variable amount of charge on a secondary gate that floats between a conventional gate and a channel. The amount of charge on this floating secondary gate changes the effective threshold voltage (Vt) of the cell and results in a variable current for a fixed top gate voltage (Vg). In conventional flash sensing schemes used in 90 nm and 65 nm process technology, a fixed current (Ids) is applied to measure the cell threshold voltage Vt and the gate voltage Vg determines a cell state.

In a multi-level cell (MLC) approach utilizing two-bit cell memory, the wordline (WL) ramps through three different levels to sense the four possible combinations of two bits in cell states 00, 01, 10, 11. Ramping to each level consumes time in the sensing process.

It is desirable to have an improved scheme for faster access time. At the same time, having a better reference for sensing by reduction of 1/f or Random Telegraph Signal (RTS) noise is also desired.

BRIEF DESCRIPTION OF THE DRAWINGS

The invention will be understood more fully from the detailed description given below and from the accompanying drawings of embodiments of the invention which, however, should not be taken to limit the invention to the specific embodiment(s) described, but are for explanation and understanding only.

DETAILED DESCRIPTION

Figure 1:
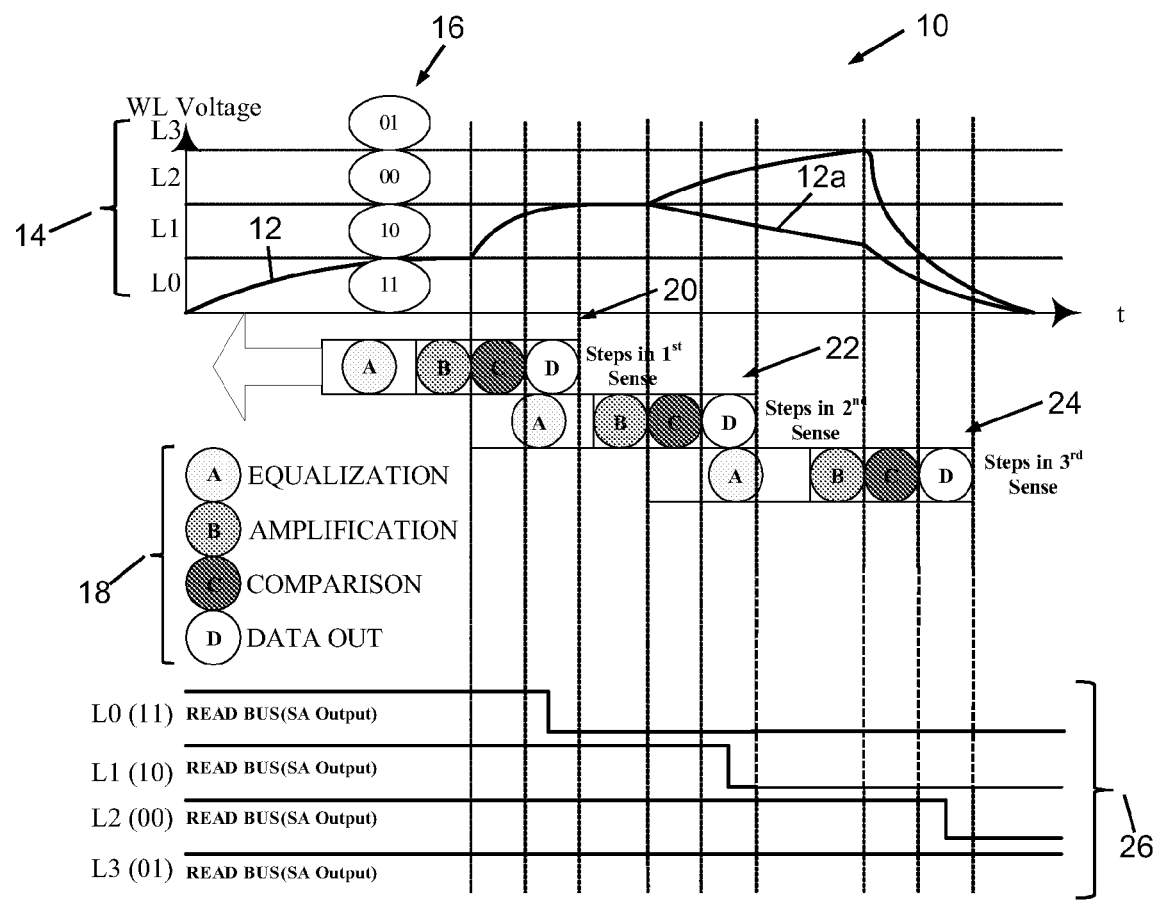
FIG. 1 is a sensing scheme used in 90 nm and 65 nm process technology products.

Referring to FIG. 1, a conventional sense scheme used in 90 nm and 65 nm process technology is shown at 10. In multi-level cell sensing, the gate voltage 12 of a flash cell steps up from a starting cell level L0 through different cell levels L1, L2, and L3, cell levels collectively shown as 14. As shown at 16, cell levels L0, L1, L2, and L3 correspond to cell states 11, 10, 00, and 01, respectively. As gate voltage 12 at a wordline (WL) ramps up, a sense operation occurs at each level for determination of the cell data. Within each sense operation, conventional steps 18 include equalization (A), amplification (B), comparison (C), and data out (D).

In a first sense operation 20, the WL ramps from L0 to L1 and goes through steps A and B. Before the first sense operation is completed, a second sense operation 22 begins with the WL ramping up from L1 to L2. The first sense operation completes with steps C and D as step A begins in the second sense operation 22. In a third sense operation 24, the WL ramps up from L2 to L3 as steps A and B occur. The second sense operation 22 finishes during step A of the third sense operation 24. The third sense operation is completed as the WL returns to L0. Depending on the sense scheme and the threshold voltage Vt of the flash cell, the gate voltage 12 may ramp down to a different voltage 12a in the third sense operation 24.

In sensing operations, a sense amplifier is used for determination of the value of cell data and the output from the sense amplifier would input data into a bus. The sense amplifier is initially set to a known state at the beginning of the sense operations. FIG. 1 further shows sense amplifier output at the various cell levels at 26, corresponding in time with steps in the sense operations 20, 22, 24.

Figure 2:
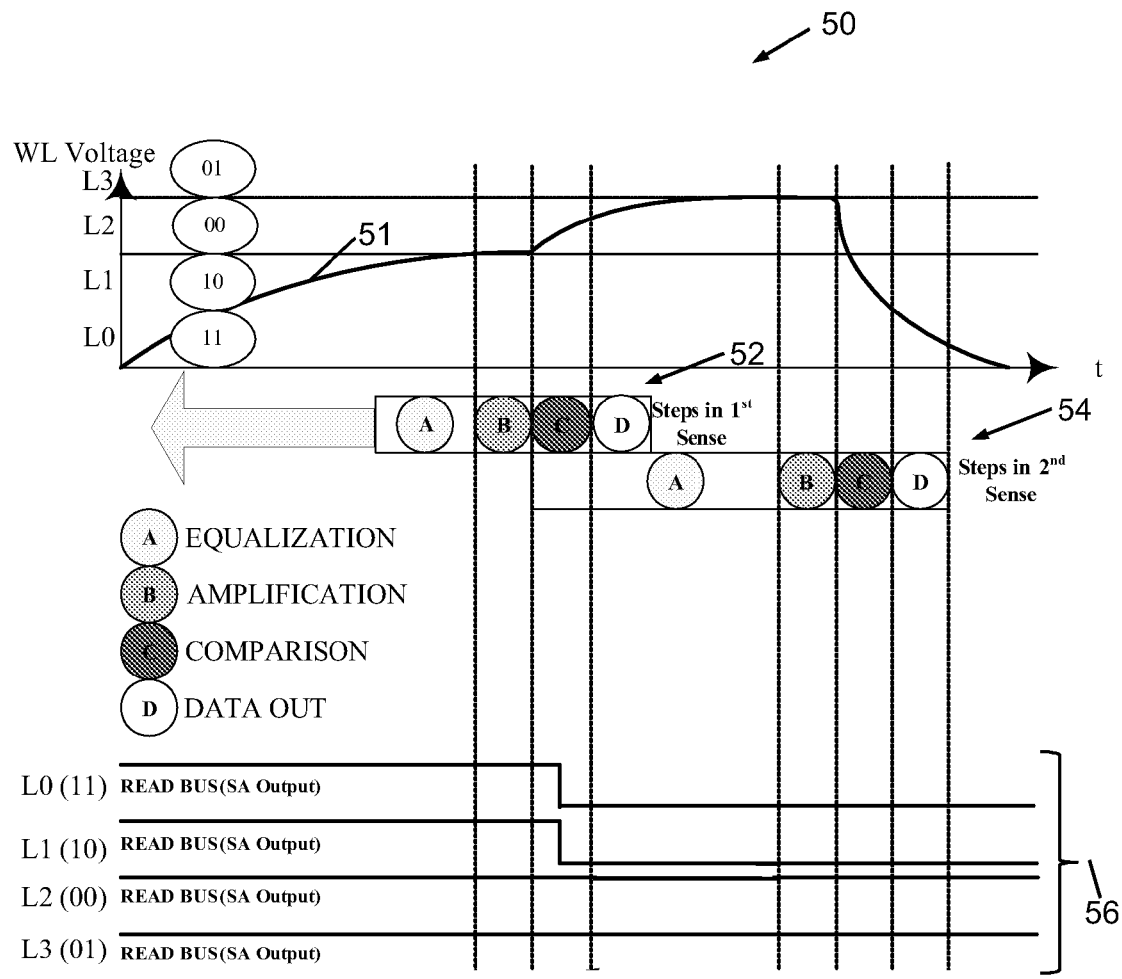
FIG. 2 is a sensing scheme according to one embodiment of the present invention.

Referring to FIG. 2, a serial-parallel sense scheme in accordance with one embodiment of the present invention is shown at 50. A wordline (WL) 51 of a flash cell would directly ramp to cell level L2 at the beginning of a first sense operation 52, and obviate the need for a sense operation at cell level L1. The WL need only ramp up to two different cell levels, namely L2 and L3 in contrast to the scheme of FIG. 1 which required WL to go through three different cell levels.

In a first sense operation 52, the WL ramps from L0 to L2 and goes through steps A and B. Before the first sense operation is completed, a second sense operation 54 begins with the WL ramping up to L3. The first sense operation completes with steps C and D as step A begins in the second sense operation 54. As the second sense operation goes through steps C and D, the voltage ramps back down, and a third sense operation is not needed. FIG. 2 further shows sense amplifier output at the various cell levels at 56, corresponding in time with steps in the sense operations 52, 54.

It is noteworthy that a most significant bit is resolved during the step C of the first sense operation 52, in contrast to the conventional sense scheme of FIG. 1. It is also noted that the gate voltage and time increments as represented in FIGS. 1 and 2 are not necessarily drawn to scale. Further, the voltage may vary from one level to another.

Figure 3:
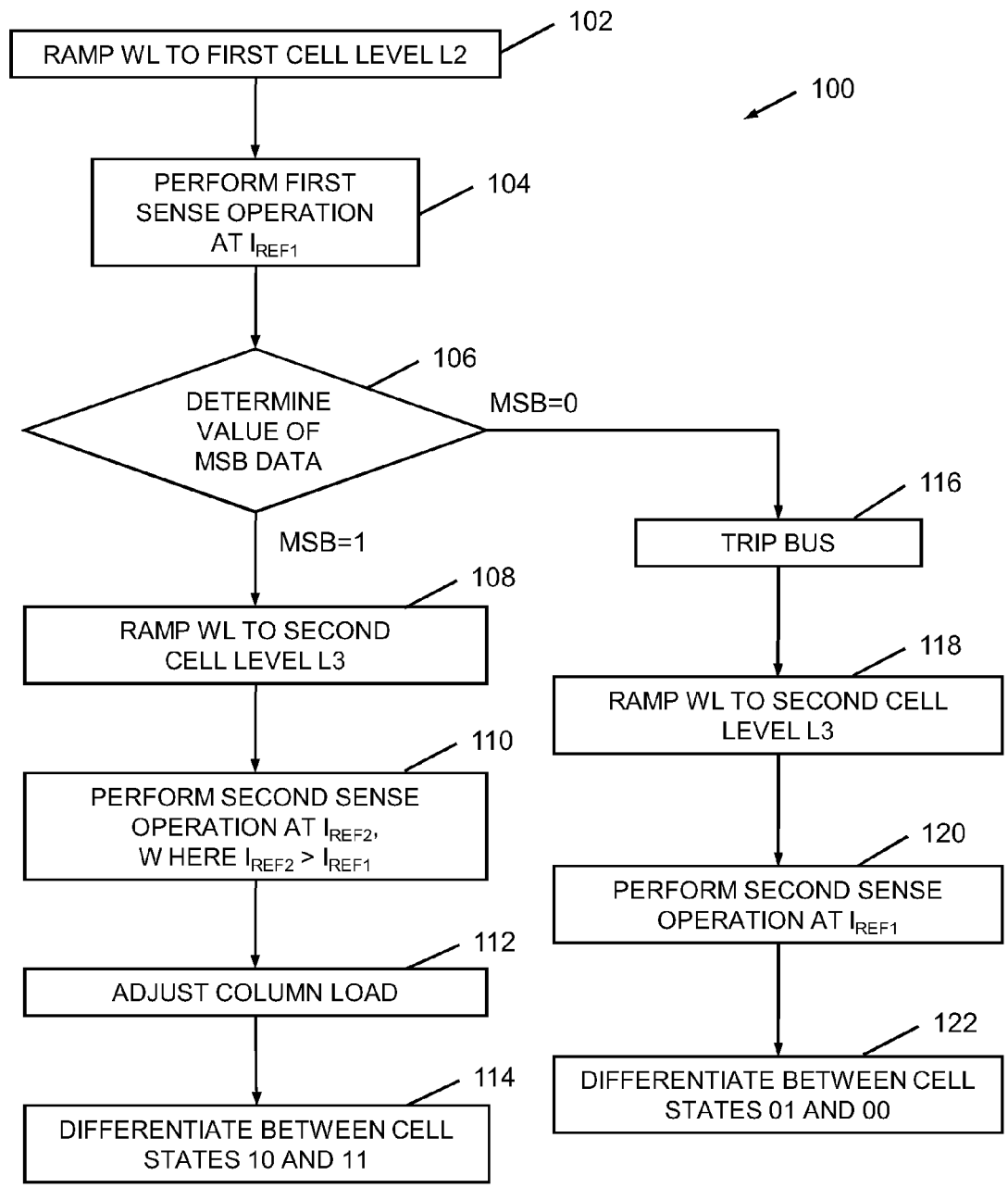
FIG. 3 is a flowchart of a method of sensing memory data according to one embodiment.

Turning to FIG. 3, a method of sensing data in a multi-level cell memory according to one embodiment of the present invention is indicated at 100. Method 100 includes, at 102, a step of ramping a wordline (WL) of a multi-level cell (MLC) flash memory to a first cell level L2. At step 104, the method includes performing a first sense operation at $I_{REF1}$, which may be defined as the equivalent reference current at the threshold voltage Vt of the flash cell. In one embodiment, the first sense operation is performed at 7.5 µA of reference current. The method 100 includes determining a value of most significant bit (MSB) data at step 106. The MSB data may be determined and captured at the end of the first sense operation when the WL is at cell level L2. Thus, the MSB data is resolved at the first sense operation. If MSB data is determined to equal 1, the method further includes step 108 of ramping the WL to a second cell level L3. At the end of the first sense operation, the WL is at L3. Method 100 further includes, at 110, performing a second sense operation at $I_{REF2}$, where $I_{REF2}$ is greater than $I_{REF1}$. In one embodiment, $I_{REF2}$ is equivalent to a reference current for an erased flash cell having L3 at its gate. For example, $I_{REF2}$ may be approximately 25 µA of reference current.

At 112, method 100 includes adjusting the column load of a sense circuit for sensing data in the MLC memory. The column load may be reconfigured in the second sense operation based on a selected reference current or based on MSB data. In one embodiment, the method may include a step of determining whether column load adjustment is needed.

Method 100 further includes step 114 where cell states 10 and 11 can be differentiated. The state of the output of the sense amplifier, which may have been previously placed at an initial known state, differentiates the cell states between cell levels L1 and L0. Hence, the data of the MLC memory is resolved.

Returning to step 106, after determining a value of MSB data, if MSB is determined to equal 0, the output from the sense amplifier trips a bus at 116. This bus may include a READ/VerifyBUS, or other bus suitable to receive output from the sense amplifier.

At step 118 of method 100, the MSB data is resolved and the wordline ramps to L3. The method includes, at 120, performing a second sense operation at $I_{REF1}$ and, at 122, differentiating between the cell states 01 (L3) or 00 (L2). The data of the MLC memory is resolved.

It is noted that the cell states and cell levels as used herein subscribe to one convention. Other conventions may be used and are considered to fall within the scope of this invention. For example, in a different convention, cell level L2 may correspond to cell state 01.

Figure 4:
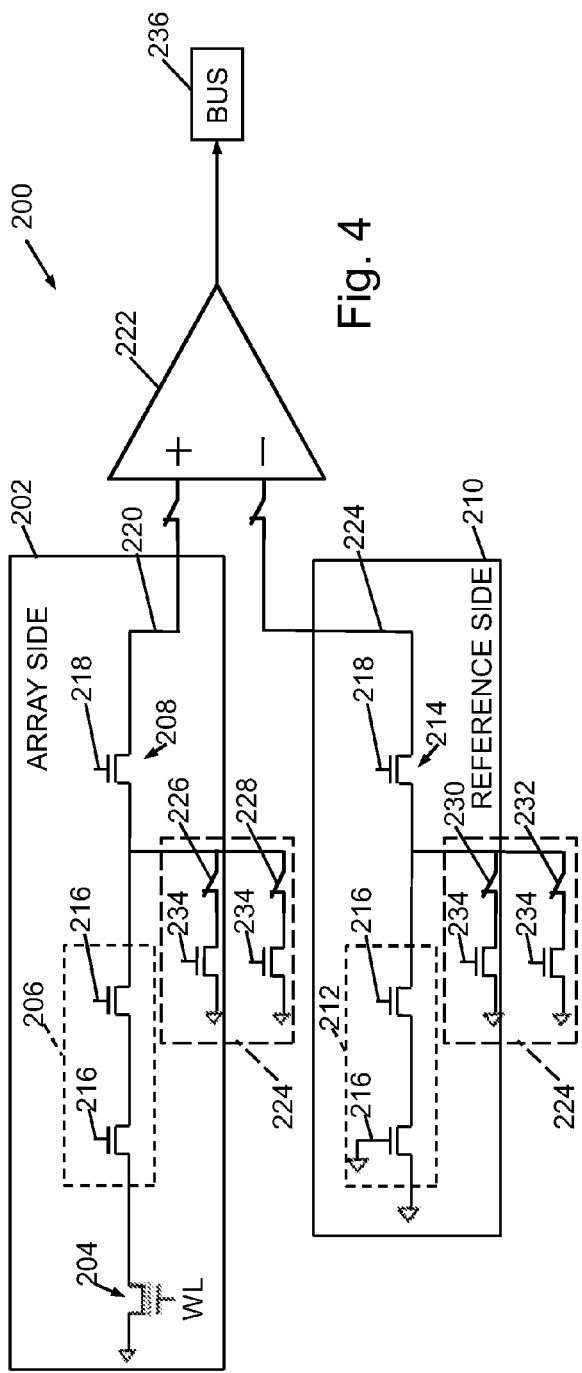
FIG. 4 is a circuit diagram according to one embodiment.

Referring to FIG. 4, a sensing circuit 200 for implementation of an MLC serial-parallel sense scheme according to one embodiment is shown. Sensing circuit 200 has an array side 202 including a flash cell 204, a decoding device 206, and a cascode device 208. The flash cell may be any non-volatile memory that can be electrically erased and reprogrammed. The control gate of the flash cell is tied to a wordline (WL) where voltage may be controlled.

Sensing circuit 200 further includes a reference side 210 including a decoding device 212 and a cascode device 214. The decoding devices 206, 212 may include a number of transistors as global and local bitline selection devices. As such, each transistor may receive a selection signal at 216. These signals may or may not be tied and varies depending on the controller (not shown) that is coupled to the transistors. The cascode devices 208, 214 may be referenced to a drain bias or cascode reference node 218.

A sense line 220 on the array side 202 provides input to a positive terminal of a sense amplifier 222. A sense line 224 on the reference side 210 provides input to a negative terminal of the sense amplifier. The cascode devices 208 and 214 may hold voltages steady on the array side and the reference side sense line input, respectively.

In one embodiment, the sensing circuit 200 uses multiple mirror devices 224 to provide different reference currents. As shown, for example, when $I_{REF1}$ is the selected current for use in a sense operation, a switch 226 at the array side of the sensing circuit is closed, while a switch 228 for $I_{REF2}$, parallel to switch for $I_{REF1}$, is open. Generally, a corresponding switch, for example, switch 230, at the reference side of the sensing circuit is closed for $I_{REF1}$ to be selected. When $I_{REF2}$ is the selected current, switches 228 and 232, at the array side and the reference side, respectively, are closed, while switches 226 and 230 are open. The multiple mirror devices are coupled to a separate reference current or signal as indicated at 234, which may or may not be tied to each other.

In an alternate embodiment, separate reference current generators may be used instead of the multiple mirror devices. The reference current generators may give design flexibility in controlling different levels in an MLC sense scheme.

The sense amplifier 222 takes the input from sense lines 220 and 224, and outputs a signal. Depending on the value of the output, the signal may trip a bus 236. As mentioned above, a bus may include a READ/VerifyBUS, or other bus suitable to receive output from the sense amplifier.

Figure 5:
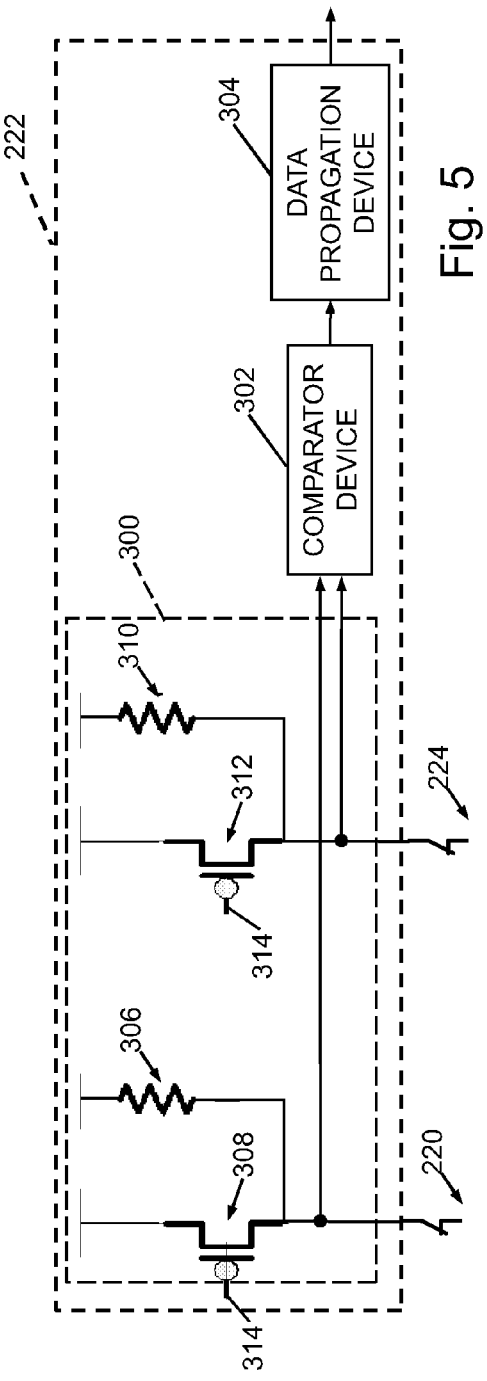
FIG. 5 is a circuit diagram of a sense amplifier of FIG. 4.

Referring to FIG. 5, one embodiment of the sense amplifier of FIG. 4 is shown in detail. The sense amplifier 222 may include a column load adjuster 300, a comparator device 302, and a data propagation device 304.

On the array side where the input to the sense amplifier 222 is coming from the sense line 220, the column load adjuster 300 may include a variable resistor 306 coupled to a kicker device 308. The kicker device may be switched on by a controller (not shown) when it is determined that the charge in decoding device 206 is insufficient. When the kicker device is on, the resistor 306 effectively adjusts the column load through the decoding device 206. Similarly, on the reference side where the input to the sense amplifier 222 is coming from the sense line 224, the column load adjuster 300 may include a variable resistor 310 coupled to a kicker device 312. Alternatively, it is not necessary for the resistance of the resistors to be variable.

The kicker devices 308 and 312 receive signals at 314 from the controller. In one embodiment, the signals may be tied to the same controller signal. In another embodiment, the signal to kicker device 308 may be different from the signal to kicker device 12, depending on the column loads in the array side 202 and the reference side 210. The additional resistance provided to each sense line may vary depending on the needs of each decoding device 206 and decoding device 212.

The comparator device 302 receives input from sense lines 220 and 224. Within the comparator device, which includes a circuit (not shown) with transistors and comparators, determinations may be made from the input. In one embodiment, the output generated by the comparator device 302 enters the data propagation device 304, which also includes a circuit (not shown) with transistors and comparators. The data propagation device may manipulate or enhance the input that it receives from the comparator device and generate output that may enter a bus. Depending on the value of the output, the bus may trip. In another embodiment, more than one output signal may be generated by the comparator device and may enter the data propagation device via a different circuit path. As a result, multiple signals may exit the data propagation device and feed to a bus.

It should be noted that other configurations of a sensing circuit and sense amplifier may be used to implement an MLC serial-parallel scheme and obtain characteristics and/or results similar to those shown and/or described above.

As seen throughout the disclosure, the MLC serial-parallel sense scheme would eliminate the need of a third sense operation required for current MLC sense scheme which could be used for faster access time (projected to reduce access time by 10 ns) or improved Read Window Budget (RWB) for 45 nm/30 nm technology timeframe. At the same time, dynamic adjustment of the column load in the circuit implementation is available.

According to one embodiment, the serial-parallel sense scheme allows performing sense operation using two stages instead of three stages of operation and also gain from the present reduction of 1/f noise by utilizing common reference current. The sense operation is reduced by approximately 20% (10-15 ns) which translates to a savings of read window budget (RWB) in the range between 100 mV to 400 mV. In turn, MLC sense operation in 30 nm and 45 nm process technology may be feasible.

It is appreciated that the invention has been explained with reference to one exemplary embodiment, and that the invention is not limited to the specific details given above. References in the specification made to other embodiments fall into the scope of the present invention.

The steps as presented in one embodiment of a method according to the present invention do not necessarily follow the particular order in which they were presented. For example, consecutive steps may occur simultaneously.

Any reference to device may include a component, circuit, module, or any such mechanism in which the device can achieve the purpose or description as indicated by the modifier preceding the device. However, the component, circuit, module, or any such mechanism is not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. A method of sensing data in a multi-level cell memory, the method comprising:
    ramping a wordline of a memory cell to a first cell level;
    performing a first sense operation at a first reference current;
    determining a value of most significant bit data of the memory cell from the first sense operation;
    ramping the wordline to a second cell level; and
    performing a second sense operation,
    wherein if the most significant bit data is determined to equal 1, said performing a second sense operation occurs at a second reference current, wherein the second reference current is greater than the first reference current, and the method further comprises adjusting column load.

2. The method of claim 1 wherein if the most significant bit data is determined to equal 0, the method further comprises tripping a bus, and wherein said performing a second sense operation occurs at the first reference current.

3. The method of claim 1 wherein the first cell level is L2 and the second cell level is L3.

4. The method of claim 1 wherein data in the multi-level cell memory is capable of being resolved in less than three sense operations.

5. The method of claim 1 wherein if the most significant bit data is determined to equal 0, the most significant bit data is resolved during the first sense operation.

6. The method of claim 1 further comprising differentiating between cell states 10 and 11 if the most significant bit data is determined to equal to 1.

7. The method of claim 1 further comprising differentiating between cell states 01 and 00 if the most significant bit data is determined to equal to 0.

8. The method of claim 1 wherein the column load is determined based on the second reference current.

9. The method of claim 1 wherein the column load is determined based on the most significant bit data.

10. The method of claim 1 wherein having the first reference current and the second reference current is achieved via multiple mirror devices.

11. The method of claim 1 wherein having the first reference current and the second reference current is achieved via separate reference current generators.

12. A sensing circuit for a multi-level cell memory, comprising:
    a flash cell coupled to a wordline;
    a sense amplifier to receive input from at least one sense line and output a signal to a bus;
    a cascode device capable of holding voltage steady for said at least one sense line and providing input to the sense amplifier;
    a decoding device coupled to the flash cell and the cascode device, and capable of receiving bitline selection signals; and
    wherein the sense amplifier includes a column load adjuster for varying the column load of the sensing circuit.

13. The sensing circuit of claim 12 wherein the column load adjuster varies the column load as the reference current changes.

14. The sensing circuit of claim 12 wherein the column load adjuster includes a variable resistor.

15. The sensing circuit of claim 12 further comprising multiple mirror devices for providing different reference currents.

* * * * *